United States Patent
Chen et al.

(10) Patent No.: US 12,453,044 B2
(45) Date of Patent: Oct. 21, 2025

(54) LIQUID COOLING HEAT DISSIPATION PLATE AND LIQUID COOLING ELECTRONIC DEVICE

(71) Applicant: SHENZHEN MICROBT ELECTRONICS TECHNOLOGY CO., LTD., Guangdong (CN)

(72) Inventors: Qian Chen, Guangdong (CN); Fangyu Liu, Guangdong (CN); Yang Gao, Guangdong (CN); Yuefeng Wu, Guangdong (CN); Haifeng Guo, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/280,839

(22) PCT Filed: Mar. 3, 2023

(86) PCT No.: PCT/CN2023/079516
§ 371 (c)(1),
(2) Date: Sep. 7, 2023

(87) PCT Pub. No.: WO2024/098592
PCT Pub. Date: May 16, 2024

(65) Prior Publication Data
US 2025/0040079 A1    Jan. 30, 2025

(30) Foreign Application Priority Data
Nov. 9, 2022    (CN) .......................... 202211395638.0

(51) Int. Cl.
*H05K 7/20*    (2006.01)

(52) U.S. Cl.
CPC ..... *H05K 7/20263* (2013.01); *H05K 7/20254* (2013.01); *H05K 7/20272* (2013.01)

(58) Field of Classification Search
CPC ........... H05K 7/20254; H05K 7/20272; H05K 7/20263; H05K 7/20409; H05K 7/20927;
(Continued)

(56) References Cited

U.S. PATENT DOCUMENTS

2005/0011635 A1 *    1/2005    Liu ....................... H01L 23/473
                                                            257/E23.098
2005/0199372 A1    9/2005    Frazer et al.
(Continued)

FOREIGN PATENT DOCUMENTS

CN    102136461 A    7/2011
CN    103769742 A    5/2014
(Continued)

OTHER PUBLICATIONS

TW M523891; Huang Jun-Ping; Water-Cooling Apparatus for seamless welding; PE2E search translation (Year: 2016).*
(Continued)

*Primary Examiner* — Michael A Matey
(74) *Attorney, Agent, or Firm* — Merchant & Gould P.C.

(57)    ABSTRACT

This application discloses a liquid cooling heat dissipation plate and a liquid cooling electronic device, wherein the liquid cooling heat dissipation plate includes a cooling plate unit, a liquid inlet and a liquid outlet are provided at side walls of the cooling plate unit, the liquid inlet is in connection with the liquid outlet through a penetrating channel, and the penetrating channel respectively penetrates two opposite mounting surfaces of the cooling plate unit; further, a pair of fin bases are respectively lapped at positions on the two mounting surfaces corresponding to the same straight channel, and the seal plate unit is lapped at a position on the
(Continued)

mounting surface corresponding to positions in the penetrating channel that are not covered by the fin base; and any two of the fin base, the seal plate unit, and the mounting surface are fastened by friction welding.

6 Claims, 12 Drawing Sheets

(58) Field of Classification Search
CPC ............. H05K 3/0061; H05K 7/20218; H05K 7/20872; H01L 23/473; H01L 25/072; H01L 23/4735; H01L 23/3672; F28F 3/12; F28D 2021/0029; F28D 1/0308; G06F 1/20; G06F 2200/201
See application file for complete search history.

(56) References Cited

U.S. PATENT DOCUMENTS

| | | | |
|---|---|---|---|
| 2006/0219388 A1* | 10/2006 | Terakado | F28F 3/12 165/80.4 |
| 2015/0116938 A1 | 4/2015 | Nakanishi et al. | |
| 2016/0183409 A1* | 6/2016 | Zhou | H01L 23/4735 165/104.31 |
| 2023/0119484 A1 | 4/2023 | Chen et al. | |

FOREIGN PATENT DOCUMENTS

| | | |
|---|---|---|
| CN | 108235653 A | 6/2018 |
| CN | 207939933 U | 10/2018 |
| CN | 109500559 A | 3/2019 |
| CN | 109952001 A | 6/2019 |
| CN | 211629257 U | 10/2020 |
| CN | 213340362 U | 6/2021 |
| CN | 213694641 U | 7/2021 |
| CN | 113365485 A | 9/2021 |
| CN | 217740970 U | 11/2022 |
| CN | 115443053 A | 12/2022 |
| IN | 107732355 A | 2/2018 |
| TW | 201621252 A | 6/2016 |

OTHER PUBLICATIONS

CN 104425406, Bogen et al. Power Semiconductor Device And Method For Manufacturing Power Semiconductor Device (Year: 2015).*
CN 112153854, Zheng et al. Cold Plate For Power Module And Motor Controller (Year: 2020).*
CN 113382618, Chen et al., Liquid Cooling Plate Radiator (Year: 2021).*
CN 205161010, Wang, A Water Cooling Plate (Year: 2016).*
CN 206340536, Li et al., An IGBT Module Board (Year: 2017).*
CN206341539, Zhou et al. An IGBT case (Year: 2017).*
CN207939933, Xiao, Cooling Radiator And Motor Controller (Year: 2018).*
CN212846700, Liu, A Friction Welding Type Water Cooling Plate (Year: 2021).*
CN217405538, Huang, A Liquid Cooling Plate, Cooling System And Vehicle (Year: 2022).*
CN 217740970, Gao et al., Water Cooling Plate And Laser (Year: 2022).*
CN 218004836, Wang et al. A Liquid Cooling Plate Structure (Year: 2022).*
CN 218388447, Ding et al., An Extrusion Section Water Cooling Radiating Structure Of Large Power Electronic Device (Year: 2023).*
International Search Report and Written Opinion for PCT/CN2023/079516 dated Jul. 19, 2023 (10 pages).
English Translation of International Search Report for PCT/CN2023/079516 (2 pages).
First Office Action dated Dec. 15, 2022 for Chinese Application No. 202211395638.0 (13 pages).
Second Office Action dated Jan. 13, 2023 for Chinese Application No. 202211395638.0 (11 pages).
Decision of Rejection dated Feb. 15, 2023 for Chinese Application No. 202211395638.0 (8 pages).

* cited by examiner

LIQUID COOLING HEAT DISSIPATION PLATE AND LIQUID COOLING ELECTRONIC DEVICE

This application is a National Stage Application of International Application No. PCT/CN2023/079516, filed 3 Mar. 2023, which claims benefit of Ser. No. 202211395638.0, filed 9 Nov. 2022 in China, and which applications are incorporated herein by reference. To the extent appropriate, a claim of priority is made to each of the above disclosed applications.

TECHNICAL FIELD

This application relates to the field of liquid cooling heat dissipation technologies, and in particular, to a liquid cooling heat dissipation plate and a liquid cooling electronic device.

BACKGROUND

Among the specific manners of heat dissipation for electronic devices including a chip, liquid cooling plates are increasingly used for heat dissipation currently.

In the existing liquid cooling plate, a cooling plate base may be formed by stamping and casting, and then upper and lower surfaces of the cooling plate base are sealed by a cooling plate end surface, on which a heat dissipation fin is provided, and the cooling plate base and the cooling plate end surface, the heat dissipation fin and the cooling plate end surface, a water inlet joint, a water outlet joint and the cooling plate base, and the like are usually welded to each other by braze welding. It is found in practice that the liquid cooling plate is prone to deformation or damage, and in a serious case, components attached on a surface of the liquid cooling plate may be damaged.

SUMMARY

For at least one aspect of the foregoing technical problem, embodiments of this application provide a liquid cooling heat dissipation plate and a liquid cooling electronic device, wherein any two of a fin base, a seal plate unit, and a mounting surface of the liquid cooling heat dissipation plate are fastened by friction welding, and thus, compared with the related art, gas will not be generated due to contact between welding slag and cooling liquid, thereby resolving the technical problem in the related art that the liquid cooling plate is damaged because of gas generation due to contact between welding slag and cooling liquid.

An embodiment of this application provides a liquid cooling heat dissipation plate, including:
  a cooling plate unit, wherein the cooling plate unit includes two opposite mounting surfaces and side walls between the two mounting surfaces, a liquid inlet and a liquid outlet are provided at the side walls, the liquid inlet is in connection with the liquid outlet through a penetrating channel, and the penetrating channel respectively penetrates the two mounting surfaces;
  a fin unit, including a pair of fin bases extending in a first direction; and
  at least one seal plate unit,
  wherein the penetrating channel includes at least one straight channel arranged in parallel, the straight channel extends in the first direction, the pair of fin bases are respectively lapped at positions on the two mounting surfaces corresponding to the same straight channel, and the seal plate unit is lapped at a position on the mounting surface corresponding to positions in the penetrating channel that are not covered by the fin base, so that the penetrating channel between the liquid inlet and the liquid outlet forms a cooling liquid flow channel; and
  any two of the fin base, the seal plate unit, and the mounting surface are fastened by friction welding.

An embodiment of this application provides a liquid cooling heat dissipation plate, including:
  a cooling plate unit, wherein the cooling plate unit includes two opposite mounting surfaces and side walls between the two mounting surfaces, a liquid inlet and a liquid outlet are provided at the side walls, the liquid inlet is in connection with the liquid outlet through a penetrating channel, and the penetrating channel respectively penetrates the two mounting surfaces;
  a fin unit; and
  a seal plate unit,
  wherein the penetrating channel includes at least one first channel, the fin unit is lapped at positions on the two mounting surfaces corresponding to the same first channel, the seal plate unit is lapped at a position on the mounting surface corresponding to positions in the penetrating channel that are not covered by the fin unit, so that the penetrating channel between the liquid inlet and the liquid outlet forms a cooling liquid flow channel; and
  any two of the fin unit, the seal plate unit, and the mounting surface are fastened by friction welding.

An embodiment of this application provides a liquid cooling heat dissipation plate, including:
  a cooling plate unit, wherein the cooling plate unit includes side walls that are circumferentially sealed, and a liquid inlet and a liquid outlet are provided at the side walls; and
  at least one fin unit, wherein the fin unit is lapped on the side walls and forms at least one second channel, and the second channel forms a cooling liquid flow channel between the liquid inlet and the liquid outlet; and the fin unit and the side walls are fastened by friction welding.

An embodiment of this application provides a liquid cooling heat dissipation plate, including:
  a fin module, wherein the fin module includes at least one fin unit, and a third channel is formed in the fin unit; and
  seal plate units, wherein a liquid inlet and a liquid outlet are provided at the seal plate units, and the seal plate units are located at two opposite ends of each third channel, so that the third channel forms a cooling liquid flow channel between the liquid inlet and the liquid outlet; and the fin module and the seal plate units are fastened by friction welding.

An embodiment of this application further provides a liquid cooling electronic device including an electronic device apparatus, wherein a liquid cooling heat dissipation plate is mounted on a surface of the electronic device apparatus in a butted manner, and the liquid cooling heat dissipation plate is the liquid cooling heat dissipation plate described above.

BRIEF DESCRIPTION OF THE DRAWINGS

To describe the technical solutions in the embodiments of this application more clearly, the following briefly describes the accompanying drawings required for describing the embodiments of this application. Apparently, the accompa

REFERENCE NUMERALS

Figure 1:
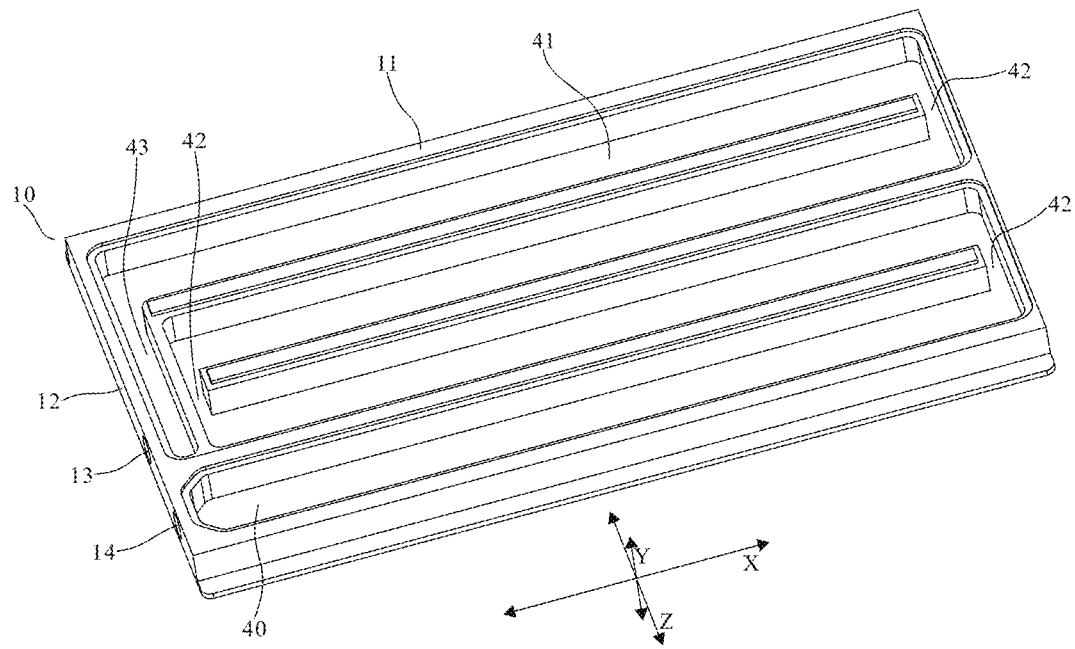
- FIG. 1 is a schematic structural diagram of a cooling plate unit according to an embodiment of this application.

10—cooling plate unit,
11—mounting surface, 12—side wall, 13—liquid inlet, 14—liquid outlet, 15—mounting flange,
16—mounting through hole,
121—first side wall, 122—second side wall,
20—fin unit, 21—fin base, 22—fin assembly,
30—seal plate unit,
31—first seal plate, 32—second seal plate, 33—end portion seal plate,
40—penetrating channel,
41—straight channel, 42—adjacent turning channel, 43—direct connection channel,
50—water inlet joint,
60—water outlet joint,
70—electronic device apparatus, 71—power supply connector,
80—adapter tube,
X—first direction, Y—second direction, and Z—third direction.

DETAILED DESCRIPTION

For a better understanding of the foregoing technical solutions, the following describes the exemplary embodiments of this application in detail with reference to the accompanying drawings, and apparently, the described embodiments are merely some but not all of the embodiments of this application, and it should be understood that, this application is not limited by the exemplary embodiments described herein.

An internal flow channel and fins in an existing liquid cooling heat dissipation plate (cooling plate for short) both are complex, wherein a cooling plate base is formed by stamping or casting in partial coordination with computerized numerical control machine tool (CNC) or in full direct coordination with CNC, wherein the fins inside the flow channel are made by a progressive die, and welding of the fins to upper and lower surfaces of the cooling plate, welding of cooling plate end surfaces, and sealed welding of joints to a liquid inlet and a liquid outlet all are implemented by braze welding. Before braze welding, welding paste needs to be smeared to the welding position, or when a surface of the welding material has a composite layer, the welding material needs to be welded with brazing flux: this is called braze welding.

In practice, the inventor of this application discovers that, welding slug generated in the foregoing braze welding manner reacts after contacting a cooling liquid (such as water) to generate gas, resulting that the liquid cooling plate is prone to deformation or damage, and in a serious case, components attached on a surface of the liquid cooling plate may even be damaged.

In an application scenario of a liquid cooling heat dissipation plate, there may be a case in which a flow channel of the liquid cooling heat dissipation plate is filled with a cooling liquid (for example, water), and a liquid inlet and a liquid outlet (for example, a water inlet and a water outlet) are completely sealed (for example, a suspending non-working state in which the water inlet and the water outlet of the liquid cooling heat dissipation plate are quick joints with a shutoff function, being disconnected from a water system, and the water inlet and the water outlet being completely sealed), and considering this case, with continuous chemical reaction between welding slug and water, generated gas continuously accumulates, and internal pressure of the liquid cooling heat dissipation plate continuously increases, eventually resulting that the liquid cooling heat dissipation plate is deformed and damaged, and components such as a printed circuit board (PCB) attached on a surface of the liquid cooling heat dissipation plate may even be damaged, which is irreparable.

Therefore, the existing liquid cooling heat dissipation plate has the foregoing defects caused by technical features of the adopted welding process during use.

In addition, the inventor of this application further discovers a case of poor heat dissipation of the existing liquid cooling heat dissipation plate due to pseudo welding between inner fins and upper and lower surfaces of the cooling plate caused by a defect in planeness or heat.

Regarding the foregoing cases, this application discloses a liquid cooling heat dissipation plate and a liquid cooling electronic device, and in the liquid cooling heat dissipation plate, a fin base and a mounting surface, a seal plate unit and the mounting surface, and the fin base and the seal plate unit are fastened by friction welding, thereby resolving the foregoing technical problem.

Figure 2:
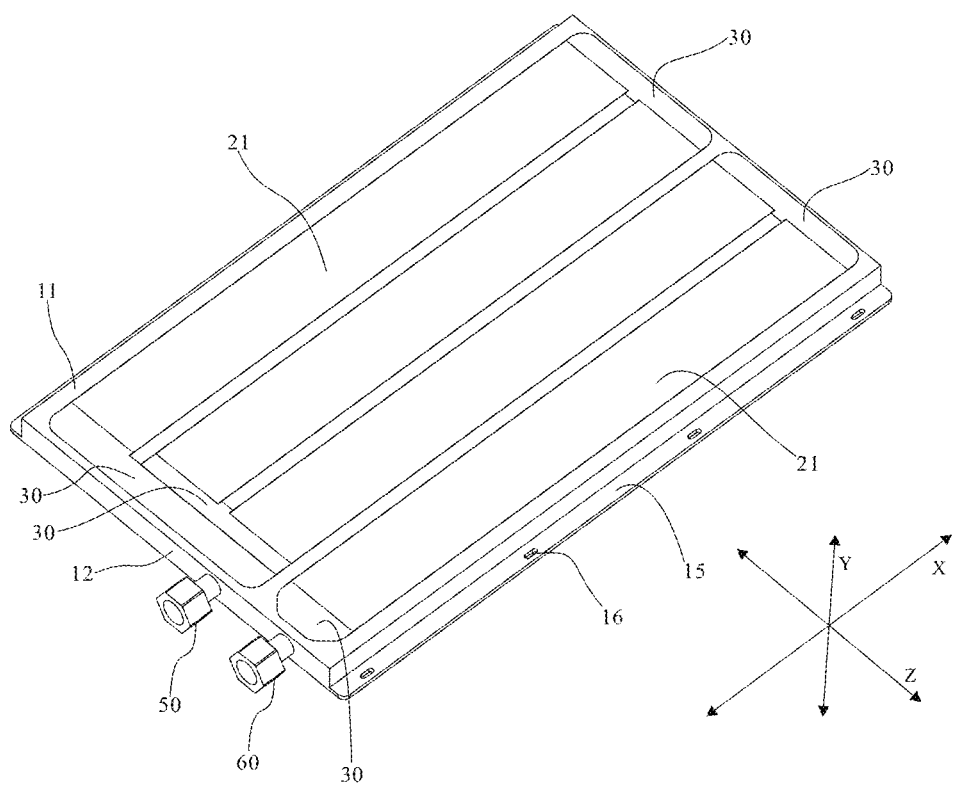
FIG. 2 is a schematic structural diagram of a mounting surface of the cooling plate unit in FIG. 1 to which a fin unit and a seal plate unit are welded.

In an embodiment of this application, a liquid cooling heat dissipation plate includes a cooling plate unit, a fin unit, and at least one seal plate unit. Referring to FIG. 1 and FIG. 2, the cooling plate unit 10 includes two opposite mounting surfaces 11 and side walls 12 between the two mounting surfaces 11, a side wall 12 is provided with a liquid inlet 13 and a liquid outlet 14, the liquid inlet 13 is in connection with the liquid outlet 14 through a penetrating channel 40, and the penetrating channel 40 respectively penetrates the two mounting surfaces 11. The fin unit 20 (marked in FIG. 15 and FIG. 16) includes a pair of fin bases 21 extending in a first direction X. Wherein the penetrating channel 40 includes at least one straight channel 41 arranged in parallel, the straight channel 41 extends in the first direction X, the pair of fin bases 21 are respectively lapped at positions on the two mounting surfaces 11 corresponding to the same straight channel 41, and the seal plate unit 30 is lapped at a position on the mounting surface 11 corresponding to positions in the penetrating channel that are not covered by the fin base 21, so that the penetrating channel 40 between the liquid inlet 13 and the liquid outlet 14 forms a cooling liquid flow channel; and any two of the fin base 21, the seal plate unit 30, and the mounting surface 11 are fastened by friction welding.

Wherein for the cooling plate unit in this embodiment, referring to FIG. 1, the cooling plate unit 10 is, for example, in a flat plate shape, and has two opposite mounting surfaces 11, side walls 12 are between the two mounting surfaces 11, and a side wall 12 is provided with a liquid inlet 13 and a liquid outlet 14; further, the liquid inlet 13 is in connection with the liquid outlet 14 through a penetrating channel 40. Specifically, the penetrating channel 40 penetrates the two mounting surfaces 11 in a second direction Y; or positions of the cooling plate unit 10 at the penetrating channel 40 are double-sided hollowed-out. Specifically, the penetrating channel on the cooling plate unit 10 may be implemented by, for example, stamping and casting or CNC, etc.

Wherein regarding the penetrating channel 40 in this embodiment, referring to FIG. 1, the penetrating channel 40 includes four straight channels 41 that are in connection, and the four straight channels 41 are arranged in parallel and extend in the first direction X.

Figure 3:
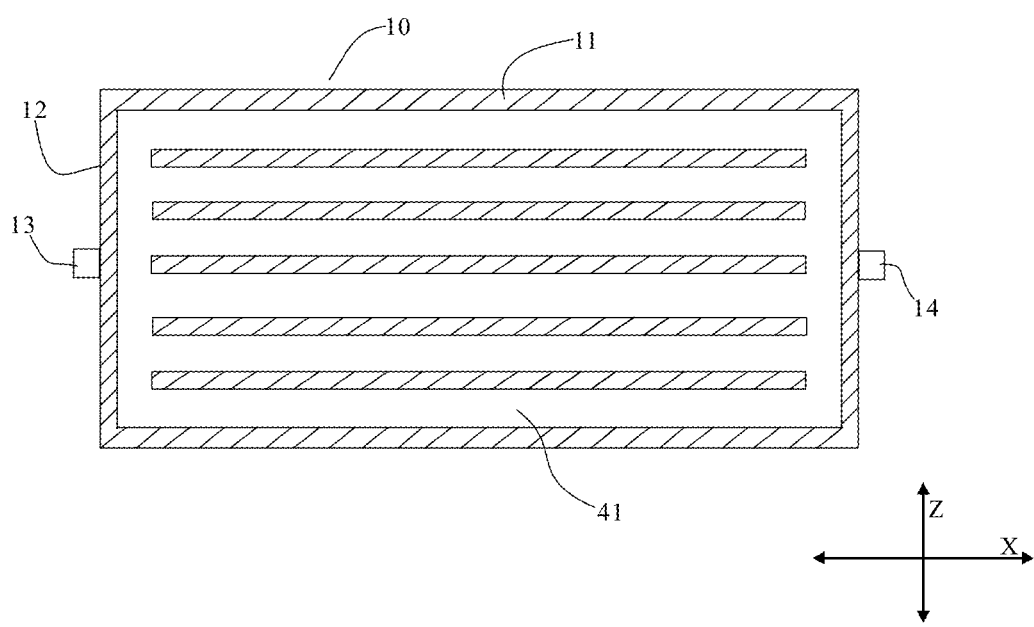
FIG. 3 is another schematic structural diagram of a cooling plate unit according to an embodiment of this application, wherein at least one straight channel is in parallel connection.

It should be understood that at least one straight channel may be in serial connection, as shown in FIG. 1, FIG. 5, FIG. 7, FIG. 9, or FIG. 11, or at least one straight channel may be in parallel connection, as shown in FIG. 3.

Figure 5:
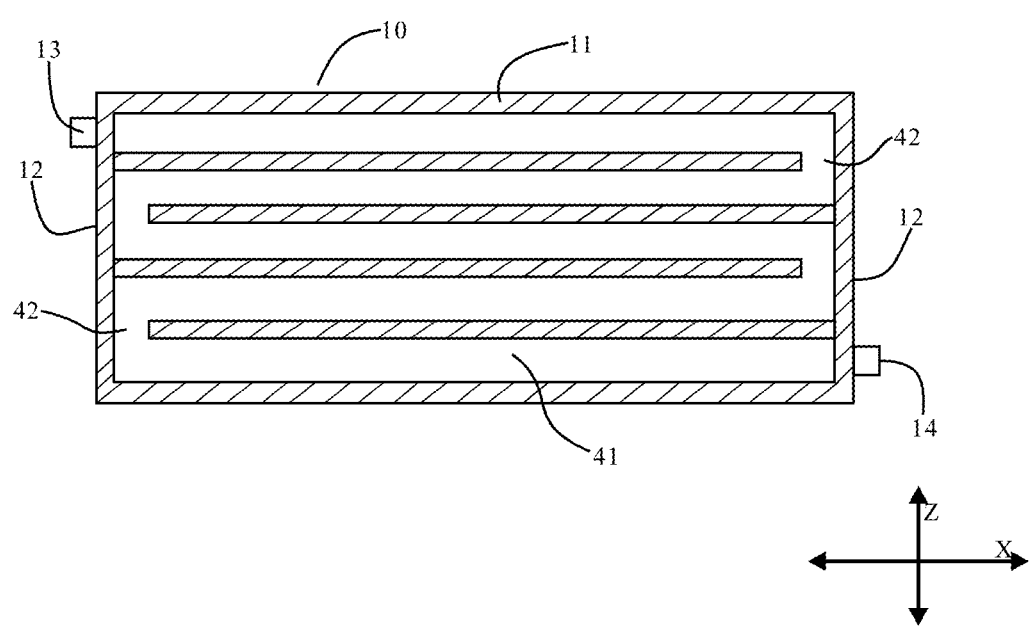
FIG. 5 is another schematic structural diagram of a cooling plate unit according to an embodiment of this application, wherein at least one straight channel is in serial connection, and a liquid inlet and a liquid outlet are respectively provided at two opposite side walls.
Figure 6:
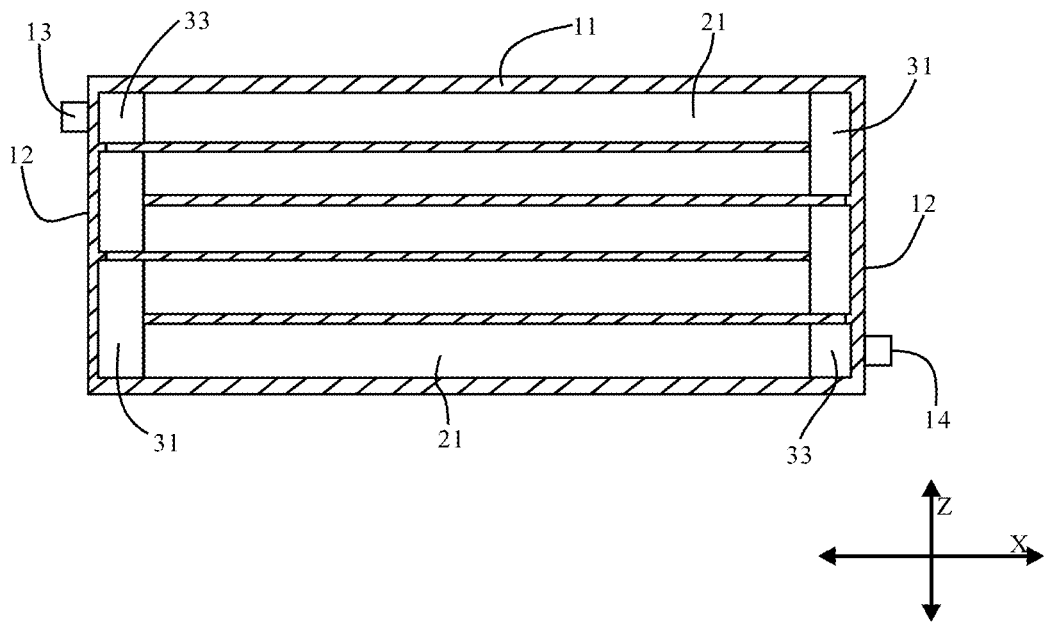
FIG. 6 is a schematic structural diagram of a mounting surface of the cooling plate unit in FIG. 5 to which a fin unit and a seal plate unit are welded.

In addition, the penetrating channel 40 respectively connects with the liquid inlet 13 and the liquid outlet 14 on the side wall 12 in the cooling plate unit 10. It should be understood that, the liquid inlet and the liquid outlet may be located at the same side wall, as shown in FIG. 1, FIG. 7, FIG. 9, and FIG. 11, or the liquid inlet and the liquid outlet may be located at different side walls, as shown in FIG. 3 and FIG. 5. No matter whether the liquid inlet and the liquid outlet are located at the same side wall or located at different side walls, the penetrating channel can always connect with the liquid inlet and the liquid outlet.

Wherein for the fin unit 20 in this embodiment, referring to FIG. 2, the fin unit 20 includes a pair of fin bases 21 extending in the first direction X, and the pair of fin bases 21 are respectively lapped at positions on the two mounting surfaces 11 corresponding to the same straight channel 41. In other words, for the double-sided hollowed-out straight channel on the cooling plate unit 10, in this embodiment, the fin bases are lapped on the two mounting surfaces of the cooling plate unit to cover the straight channels.

Wherein for the seal plate unit 30 in this embodiment, still referring to FIG. 2, the seal plate unit 30 is used to cover the positions on the mounting surfaces 11 corresponding to positions in the penetrating channel that are not covered by the fin base 21, and in other words, regions of the penetrating channel 40 in the hollowed-out region of the two mounting surfaces 11 that are not covered by the fin base 21 may all be covered by the seal plate unit 30.

Wherein for welding and fastening of the fin base 21, the seal plate unit 30, and the mounting surface 11 of this embodiment, any two of the fin base 21, the seal plate unit 30, and the mounting surface 11 are fastened by friction welding. In this case, it should be understood that the fin base 21 and the seal plate unit 30 that cover the mounting surfaces 11 both are fastened by friction welding.

Friction welding refers to a method in which under heat generated when end surfaces of workpieces move and rub against each other, end portions reach a thermoplastic state and then are quickly upset, to complete welding. No other substance is introduced to friction welding, thereby keeping clean and neat inside the cooling liquid flow channel. Alternatively, when a cooling liquid flows or stays in the cooling liquid flow channel, the cooling liquid does not react chemically with welding slug to generate gas, thereby avoiding a phenomenon that the liquid cooling heat dissipation plate is damaged or deformed due to accumulated gas.

It should be understood that, a quantity and shape of the seal plate units 30 in this embodiment may not be fixed and may be determined according to specific arrangement, size, and the like of the penetrating channel.

Through the foregoing description, it should be understood that in this embodiment, the penetrating channel formed by connecting at least one parallel straight channel is double-sided hollowed-out on the two mounting surfaces, wherein the fin base is used to cover hollowed-out positions corresponding to the straight channel, while the remaining hollowed-out positions (for example, hollowed-out positions at turning positions) in the penetrating channel may be sealed and covered by the seal plate unit.

The embodiments of this application provide a liquid cooling heat dissipation plate and a liquid cooling electronic device, wherein the liquid cooling heat dissipation plate includes a cooling plate unit, and a liquid inlet and a liquid outlet are provided at side walls of the cooling plate unit, the liquid inlet is in connection with the liquid outlet through a penetrating channel, and the penetrating channel respectively penetrates two opposite mounting surfaces of the cooling plate unit; Further, a fin unit includes a pair of fin bases, the pair of fin bases are respectively lapped at positions on the two mounting surfaces corresponding to the same straight channel, and a seal plate unit is lapped at a position on the mounting surface corresponding to positions in the penetrating channel that are not covered by the fin base; in other words, after the penetrating channel is lapped and sealed by the fin unit and the seal plate unit, a cooling liquid flow channel may be formed between the liquid inlet and the liquid outlet; and any two of the fin base, the seal plate unit, and the mounting surface are fastened by friction welding. Because no other substance such as brazing flux will be introduced to this friction welding method, a phenomenon will not occur that welding slug contacts a cooling liquid to generate gas; therefore, compared with the existing liquid cooling plate, the liquid cooling heat dissipation plate of this application can effectively avoid a case in which the liquid cooling plate is damaged because of gas generated by contact between welding slug and a cooling liquid, thereby increasing the service life of the liquid cooling heat dissipation plate, and further lowering a possibility that components on a surface of the liquid cooling plate are damaged due to damage, deformation, or the like of the liquid cooling plate, and increasing use safety of the liquid cooling heat dissipation plate.

Figure 4:
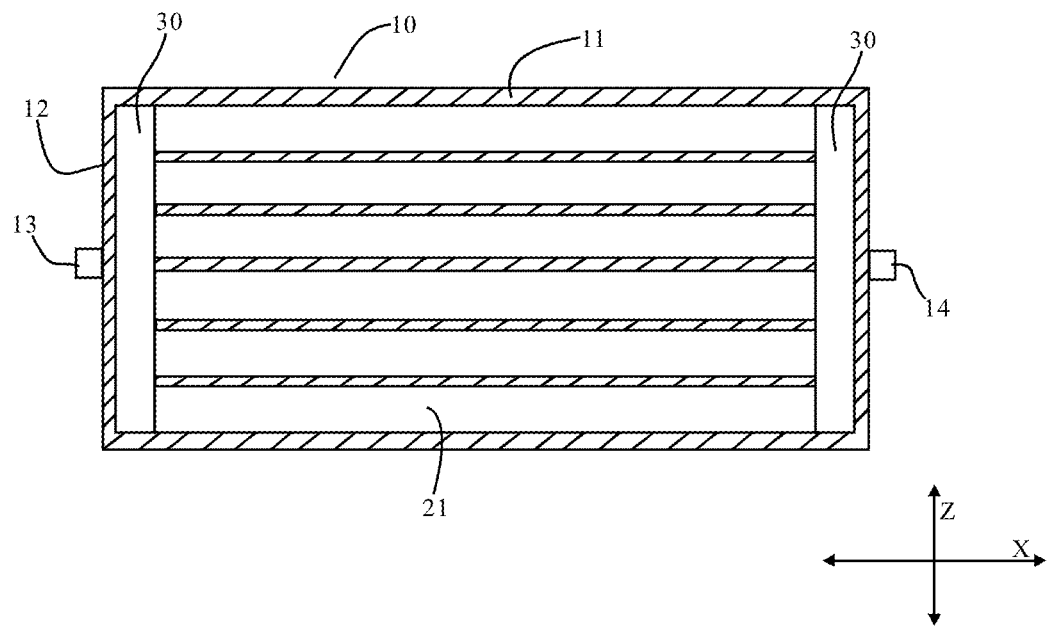
FIG. 4 is a schematic structural diagram of a mounting surface of the cooling plate unit in FIG. 3 to which a fin unit and a seal plate unit are welded.

In a possible implementation, referring to FIG. 3 and FIG. 4, at least one straight channel 41 is in parallel connection between the liquid inlet 13 and the liquid outlet 14, and the liquid inlet 13 and the liquid outlet 14 are respectively provided at two opposite side walls 12.

Figure 9:
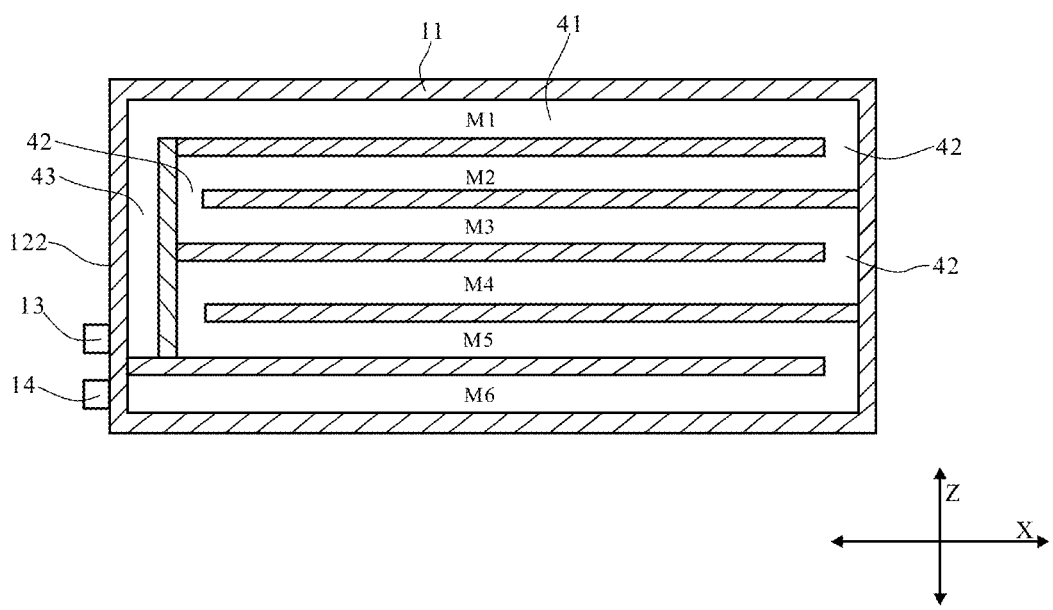
FIG. 9 shows a possible connection manner of a penetrating channel when a cooling plate unit includes six straight channels according to an embodiment of this application.
Figure 11:
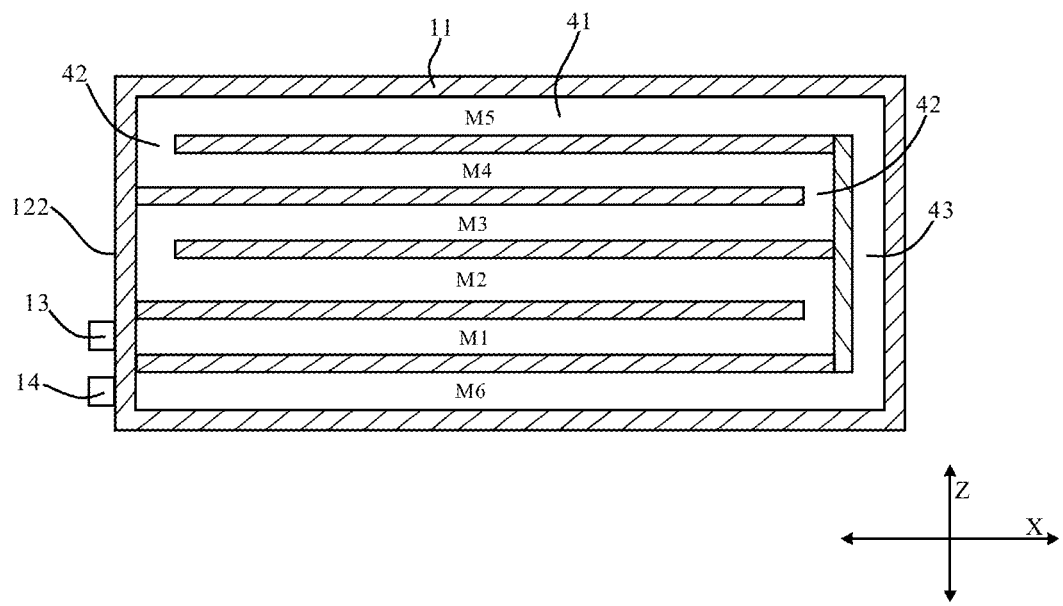
FIG. 11 shows another possible connection manner of a penetrating channel when a cooling plate unit includes six straight channels according to an embodiment of this application.

In a possible implementation, at least one straight channel 41 is in serial connection between the liquid inlet 13 and the liquid outlet 14. In this case, the liquid inlet and the liquid outlet may be provided at two opposite side walls, as shown in FIG. 5; or the liquid inlet and the liquid outlet may be provided at the same side wall, as shown in FIG. 7, FIG. 9, and FIG. 11, in which details are illustrated in the following descriptions.

In a possible implementation, the side walls 12 include a first side wall 121 extending in a third direction Z, the third direction Z being perpendicular to the first direction X; wherein the liquid inlet 13 and the liquid outlet 14 are respectively provided at two ends of the first side wall 121 in the third direction Z.

Figure 7:
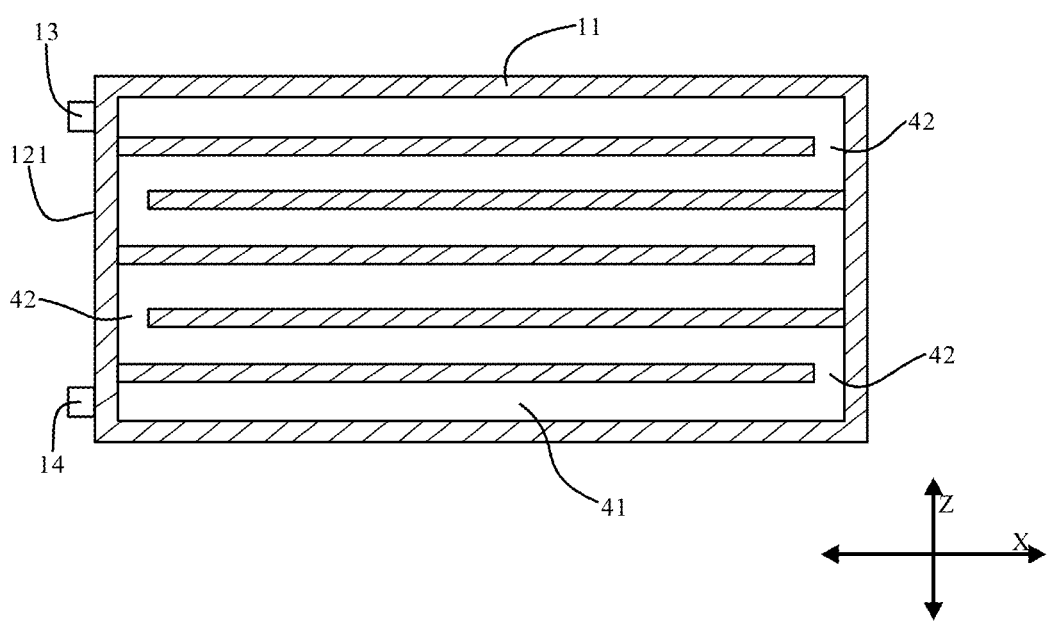
FIG. 7 is another schematic structural diagram of a cooling plate unit according to an embodiment of this application, wherein at least one straight channel is in serial connection, and a liquid inlet and a liquid outlet are respectively provided at two ends of a first side wall.

Referring to FIG. 7, considering that, in actual application, for ease of use, the liquid inlet 13 and the liquid outlet 14 are usually located at the same side wall, and thus, the liquid inlet 13 and the liquid outlet 14 are respectively provided at the two ends of the first side wall 121 in the third direction Z; wherein the first side wall 121 is a side wall on one end of the cooling plate unit 10 in the first direction X.

In an embodiment, the seal plate unit 30 includes at least a first seal plate 31, and the first seal plate 31 is lapped at a position on the mounting surface 11 corresponding to an adjacent turning channel 42; wherein the adjacent turning channel 42 connects two adjacent straight channels 41.

Figure 8:
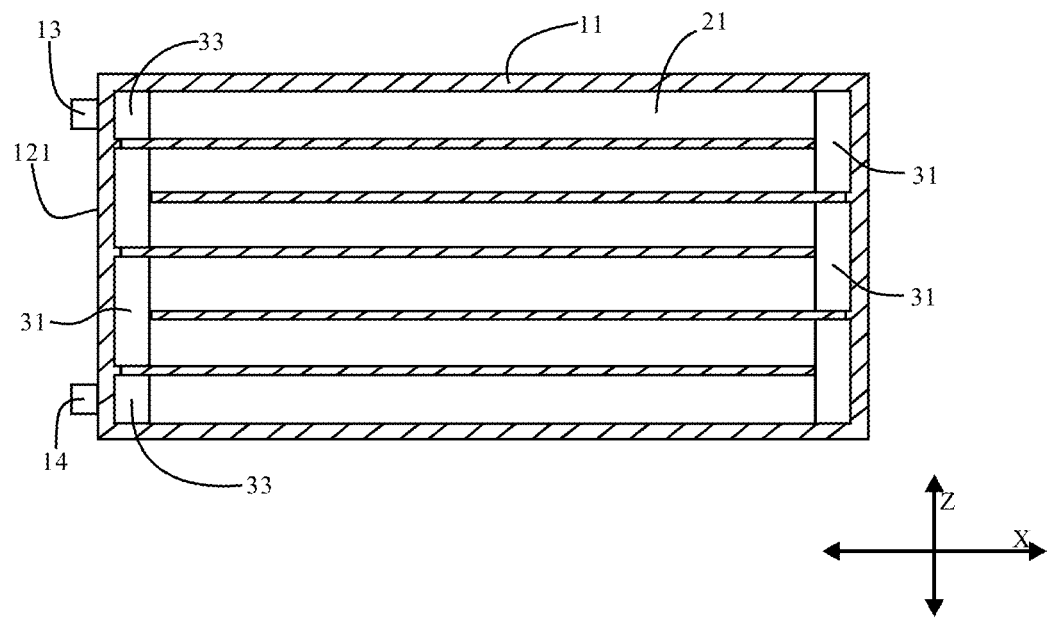
FIG. 8 is a schematic structural diagram of a mounting surface of the cooling plate unit in FIG. 7 to which a fin unit and a seal plate unit are welded.

Specifically, referring to FIG. 7 and FIG. 8 together, the first direction X may be, for example, a horizontal direction in FIG. 7 and FIG. 8, and the liquid inlet and the liquid outlet are located at, for example, a left side in FIG. 7 and FIG. 8, and further, the adjacent turning channel 42 is used to connect two straight channels on an end portion, and in this case, the adjacent turning channel may be covered and sealed by the first seal plate 31.

In addition, still referring to FIG. 8, the seal plate unit 30 further includes an end portion seal plate 33, and the end portion seal plate 33 is lapped at a position on the mounting surface 11 corresponding to a position in the penetrating channel 40 close to the liquid inlet 13 and/or the liquid outlet 14.

In other words, for the case shown in FIG. 7 in which at least one straight channel is in serial connection and the liquid inlet and the liquid outlet are respectively provided at two ends of the same side wall, the cooling plate unit may seal the penetrating channel through the fin unit, the first seal plate and the end portion seal plate, to form a cooling liquid flow.

In a possible implementation, the side walls 12 include a second side wall 122 extending in a third direction Z, and the third direction Z is perpendicular to the first direction X; wherein the liquid inlet 13 and the liquid outlet 14 are provided at the same end of the second side wall 122 in the third direction Z.

Figure 13:
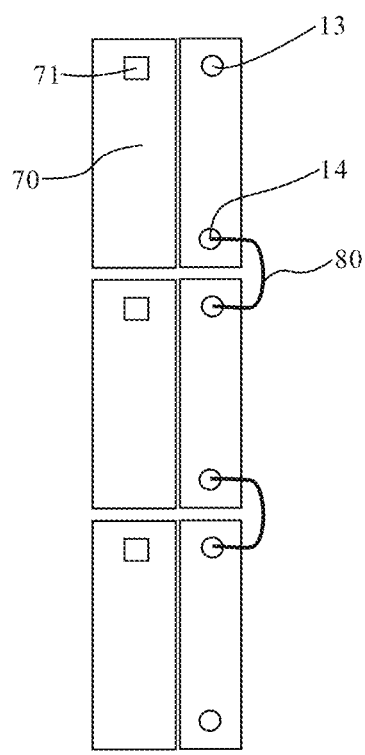
FIG. 13 is a schematic structural diagram of a plurality of liquid cooling heat dissipation plates in serial connection according to an embodiment of this application, wherein a liquid inlet and a liquid outlet of each liquid cooling heat dissipation plate are respectively provided at two ends of a first side wall.
Figure 14:
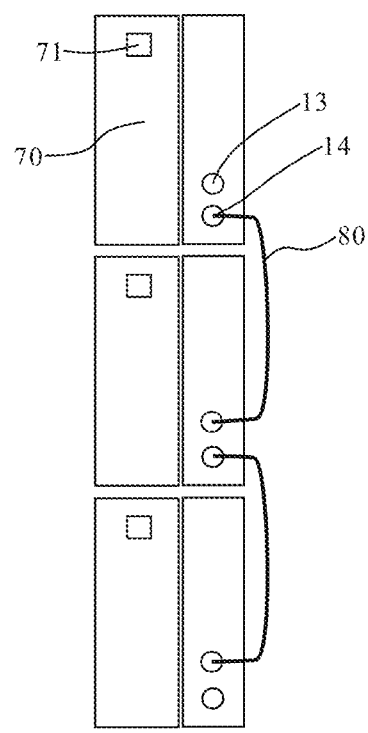
FIG. 14 is a schematic structural diagram of a plurality of liquid cooling heat dissipation plates in serial connection according to an embodiment of this application, wherein a liquid inlet and a liquid outlet of each liquid cooling heat dissipation plate are provided at one end of a second side wall.

It is also under consideration that, in actual application, for ease of use, the liquid inlet 13 and the liquid outlet 14 usually are further located at the same end of the same side wall, in addition to being located at the same side wall; reasons are as follows:

On one hand, referring to FIG. 13 and FIG. 14, the liquid cooling heat dissipation plate may be used in series with another liquid cooling heat dissipation plate, for example, the liquid outlet 14 of one liquid cooling heat dissipation plate may be in connection with the liquid inlet 13 of an adjacent liquid cooling heat dissipation plate through an adapter tube 80. FIG. 13 shows a case in which the liquid inlet and the liquid outlet are respectively provided at two ends of the same side wall, and as can be seen, in this case, the liquid outlet of one liquid cooling heat dissipation plate is close to the liquid inlet of a next liquid cooling heat dissipation plate, and the adapter tube is short, which is not convenient for mounting of the adapter tube 80. In FIG. 14, the liquid inlet 13 and the liquid outlet 14 are provided at one end of the same side wall close to each other, and as can be seen, in this case, the liquid outlet 14 of one liquid cooling heat dissipation plate is far from the liquid inlet 13 of a next liquid cooling heat dissipation plate, and the liquid inlet of the liquid cooling heat dissipation plate is also far from the liquid outlet of a previous liquid cooling heat dissipation plate, which is convenient for mounting of the adapter tube 80.

On the other hand, still referring to FIG. 13 and FIG. 14, the liquid inlet 13 and the liquid outlet 14 are provided at one end of the same side wall close to each other. In this case, a power supply connector 71 of an electronic device apparatus 70 mounted on the liquid cooling heat dissipation plate in a butted manner may be located at the other end, thereby separating water from electricity and increasing use safety.

In another embodiment, the liquid inlet 13 and the liquid outlet 14 may be provided at the same side wall of the liquid cooling plate, and a PCB carrying electronic components is attached on an upper (and/or lower) surface of the cooling plate, and a power supply side of the PCB is designed on the other side wall (that is, the side wall with no liquid inlet or liquid outlet) of the cooling plate, thereby still separating water from electricity.

In an embodiment, the seal plate unit 30 includes at least a first seal plate 31 and a second seal plate 32, wherein the first seal plate 31 is lapped at a position on the mounting surface 11 corresponding to an adjacent turning channel 42, and the adjacent turning channel 42 connects two adjacent straight channels 41; the second seal plate 32 is lapped at a position on the mounting surface 11 corresponding to a direct connection channel 43, the direct connection channel 43 extends in the third direction X, and the direct connection channel 43 is used to connect two straight channels 41 on two sides of the cooling plate unit 10 or used to connect the straight channel 41 with the liquid inlet 13 or the liquid outlet 14.

Specifically, referring to FIG. 9 and FIG. 11, which show two possible connection manners of the penetrating channel when the liquid inlet 13 and the liquid outlet 14 are provided at the same end of the second side wall 122.

As can be seen, the two connection manners both include two types of turning channels, in which one type is the adjacent turning channel connecting two adjacent straight channels, and the other type is the direct connection channel connecting two straight channels on two sides of the cooling plate unit, or the direct connection channel is further used to connect the straight channel with the liquid inlet or the liquid outlet.

Specifically, as shown in FIG. 9 and FIGS. 11, M1 to M6 respectively represent straight channels in serial connection.

Figure 10:
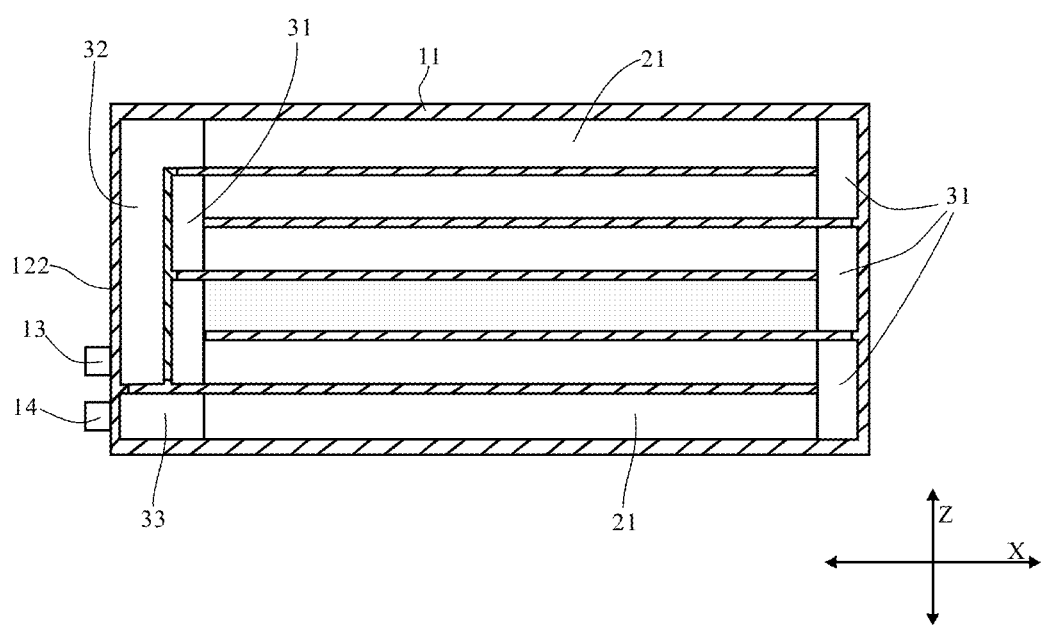
FIG. 10 is a schematic structural diagram of a mounting surface of the cooling plate unit in FIG. 9 to which a fin unit and a seal plate unit are welded.

In FIG. 9, there are adjacent turning channels at a connection position on right ends of M1 and M2, a connection position on right ends of M3 and M4, a connection position on right ends of M5 and M6, a connection position on left ends of M2 and M3, and a connection position on left ends of M4 and M5, and referring to FIG. 10, the adjacent turning channels are respectively covered by the first seal plate 31; further referring to FIG. 9 again, M1 is in connection with the liquid inlet 13 through the direct connection channel 43, and referring to FIG. 10, the direct connection channel is covered by the second seal plate 32.

Figure 12:
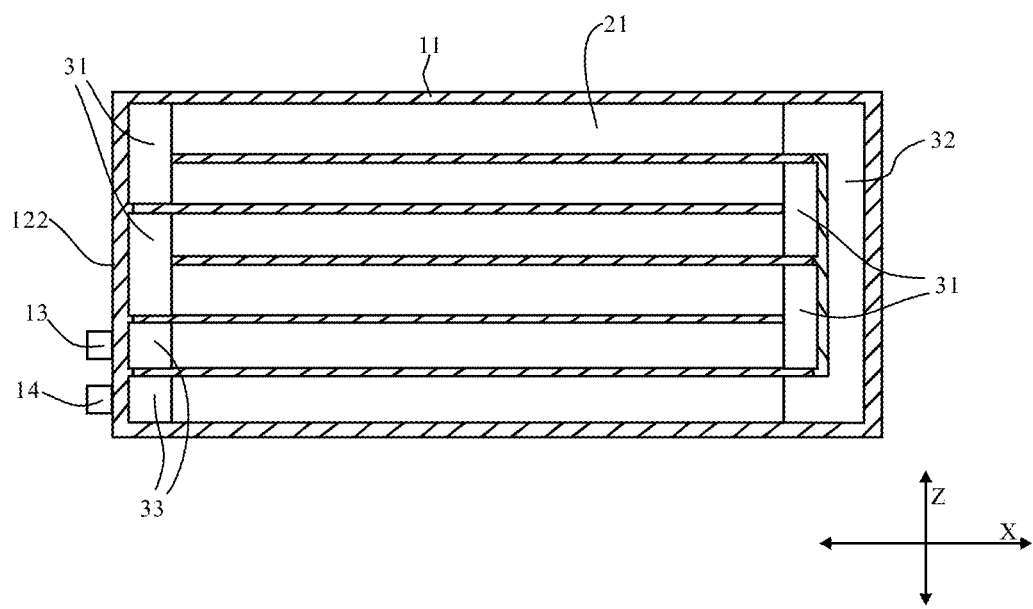
FIG. 12 is a schematic structural diagram of a mounting surface of the cooling plate unit in FIG. 11 to which a fin unit and a seal plate unit are welded.

In FIG. 11, similarly, there are adjacent turning channels 42 at a connection position on right ends of M1 and M2, a connection position on right ends of M3 and M4, a connection position on left ends of M2 and M3, and a connection position on left ends of M4 and M5, and referring to FIG. 12, the adjacent turning channels 42 are respectively covered by the first seal plate 31; further referring to FIG. 11 again, there is a direct connection channel 43 at a connection position on right ends of M5 and M6, and referring to FIG. 12, the direct connection channel is covered by the second seal plate 32.

In other words, for the case shown in FIG. 9 or FIG. 11 in which at least one straight channel is in serial connection and the liquid inlet and the liquid outlet are respectively provided at one end of the same side wall, the cooling plate unit may seal the penetrating channel through the fin unit, the first seal plate, the second seal plate, and the end portion seal plate 33, to form a cooling liquid flow channel.

In this embodiment, still referring to FIG. 10 and FIG. 12, the seal plate unit 30 further includes an end portion seal plate 33, and the end portion seal plate 33 is lapped at a position on the mounting surface 11 corresponding to a position in the penetrating channel 40 close to the liquid inlet 13 and/or the liquid outlet 14.

It should be understood that, the first side wall 121 and the second side wall 122 only represent different arrangement manners of the liquid inlet and the liquid outlet on the first side wall 121 and the second side wall 122, wherein the liquid inlet and the liquid outlet on the first side wall 121 are respectively provided at two ends far from each other, and the liquid inlet and the liquid outlet on the second side wall 122 are provided at one end close to each other.

In a possible implementation, the liquid cooling heat dissipation plate further includes a water inlet joint 50 and a water outlet joint 60. The water inlet joint 50 is fastened to the liquid inlet 13 by friction welding; and the water outlet joint 60 is fastened to the liquid outlet 14 by friction welding.

That is, referring to FIG. 1 and FIG. 2 together, the water inlet joint and the water outlet joint in this embodiment are also fastened by friction welding, which can avoid welding slug or the like at the joints.

In a possible implementation, referring to FIG. 2, each of two sides of at least one of the two mounting surfaces 11 in the first direction X is protruded with a mounting flange 15, wherein the mounting flange 15 is provided with mounting through holes 16, and the mounting through holes 16 are used for fastening and mounting with the electronic device apparatus 70.

In a possible implementation, an inner surface of at least one of the pair of fin bases 21 is protruded with a fin assembly 22 in the second direction Y, wherein the fin assembly 22 extend in the first direction X, the fin assembly 22 and the fin base 21 are integrally formed, and the second direction is perpendicular to the first direction.

Figure 15:
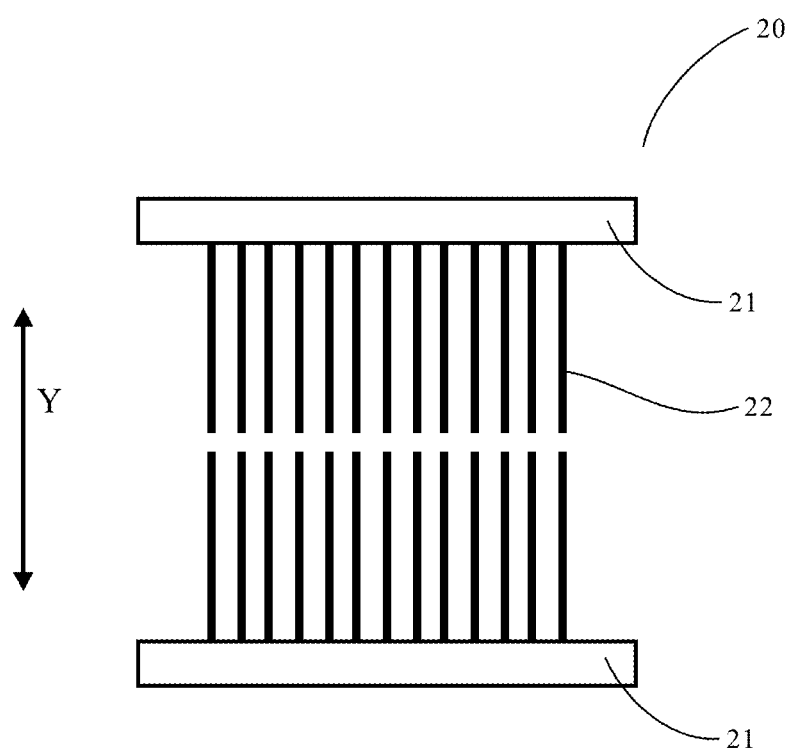
FIG. 15 is a schematic structural diagram of the fin unit according to an embodiment of this application.
Figure 17:
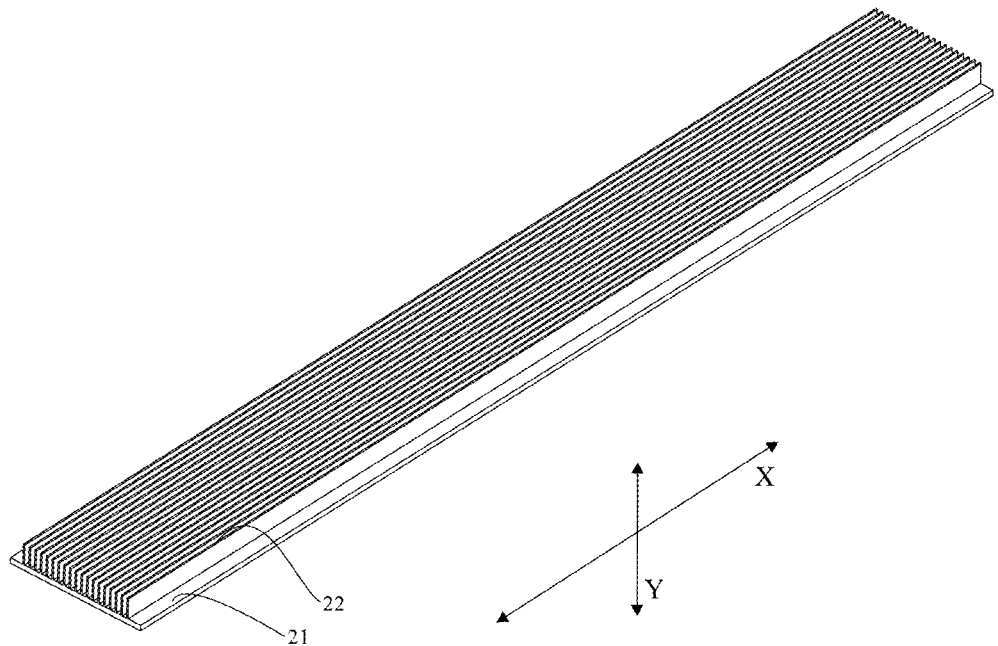
FIG. 17 is a schematic structural diagram of a fin base protruded with a fin assembly according to an embodiment of this application.

First, referring to FIG. 15, each of the pair of fin bases 21 in FIG. 15 is protruded with a fin assembly 22, and the fin assembly 22 and the fin bases 21 are integrally formed, and may be, for example, an aluminum extrusion fin; further, referring to FIG. 17, the fin base 21 and the fin assembly 22 extend in the first direction X, and it should be understood that the fin assembly 22 may include at least one fin arranged in parallel. In this embodiment, the fin base and the fin assembly are integrally formed, thereby avoiding a case of poor heat dissipation between the fin base and the fin assembly due to pseudo welding.

Figure 18:
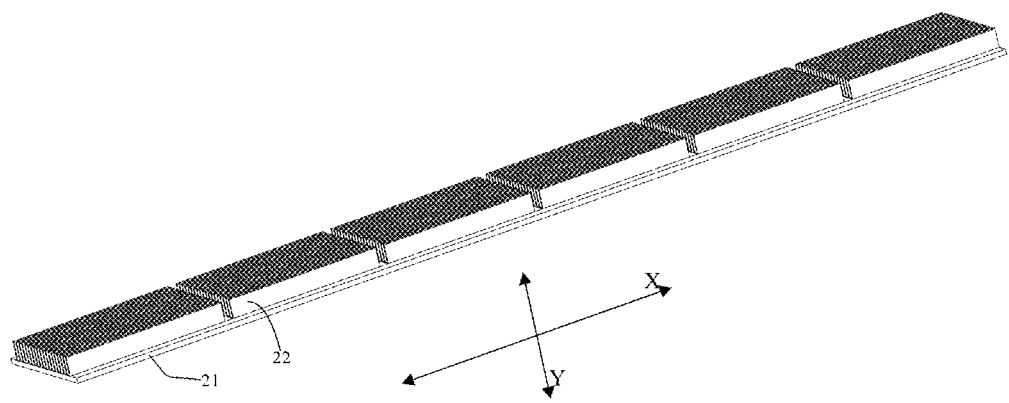
FIG. 18 is a schematic structural diagram of the fin assembly arranged in sections in a first direction according to an embodiment of this application.

In this embodiment, it should be understood that, a height of the fin assembly 22 in the second direction Y is less than half of a height of the cooling plate unit 10 in the second direction Y; in addition, referring to FIG. 18, the fin assembly 22 on the fin base 21 may also be arranged in sections in the first direction X. In this way, on one hand, at least one fin of the fin assembly has a larger contact area with the cooling liquid, and on the other hand, disturbances of the cooling liquid can be increased at the sectional positions of the fin assembly and the heat dissipation effect can be improved.

Figure 16:
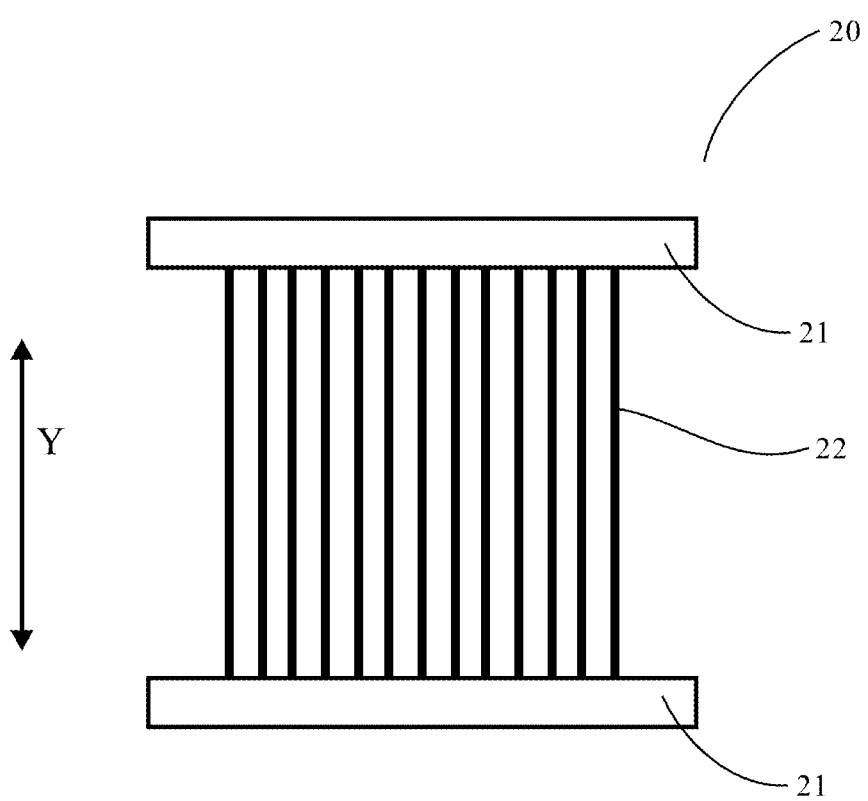
FIG. 16 is another schematic structural diagram of the fin unit according to an embodiment of this application.

It should be understood that, one of the two fin bases in FIG. 15 may be protruded with a fin assembly and the other may not have any fin assembly; in addition, referring to FIG. 16, the pair of two fin bases 21 may also be fixedly connected through the fin assembly 22, and optionally, may be fixedly connected by a friction welding process or integrally formed into the structure shown in FIG. 16 by an aluminum extrusion process. In this case, a connection channel between the two adjacent fin bases required when a cooling liquid flow channel is formed by the fin bases, that is, the adjacent turning channel 42, and/or the direct connection channel 43, may be formed by milling out fins in a corresponding region by using a CNC process.

In another embodiment, the height of the fin assembly 22 in the second direction Y may also be greater than half of the height of the cooling plate unit 10 in the second direction Y, and in this case, the fin assemblies of the pair of fin bases are inserted between each other (that is, fins respectively located at the two fin bases each have a part that can form a common projection), and a depth of the insertion may be an optimal depth obtained according to practice. Specifically, in practice, as a height of the fin increases, an area of heat dissipation increases, and if the height of the fin continues to increase, heat dissipation of the fin is not optimized but flow resistance is increased, and therefore, a specific parameter of the optimal depth may be determined by comprehensively considering the overall effect of the height/area of the fin, the heat dissipation effect, and the flow resistance.

It should be noted that, FIG. 1 to FIG. 18 are only for ease of comprehension. In this implementation, shapes of the channels may linearly extend freely, and are not limited to extending along a straight line as shown in the foregoing accompanying drawings. In addition, the fin unit in this implementation may be in the integrally formed structure shown in FIG. 16, and is not limited to necessarily including a pair of fin units. In addition, extending directions of the channels, the side walls, and the like are not limited to the first direction, the second direction, and the third direction in the accompanying drawings, and may be corresponding directions formed based on relationships between these channels, side walls, and the like.

Therefore, this application further provides a liquid cooling heat dissipation plate, including:
- a cooling plate unit, wherein the cooling plate unit includes two opposite mounting surfaces and side walls between the two mounting surfaces, a liquid inlet and a liquid outlet are provided at the side walls, the liquid inlet is in connection with the liquid outlet through a penetrating channel, and the penetrating channel respectively penetrates the two mounting surfaces;
- a fin unit; and
- a seal plate unit,
- wherein the penetrating channel includes at least one first channel, the fin unit is lapped at positions on the two mounting surfaces corresponding to the same first channel, the seal plate unit is lapped at a position on the mounting surface corresponding to positions in the penetrating channel that are not covered by the fin unit, so that the penetrating channel between the liquid inlet and the liquid outlet forms a cooling liquid flow channel; and
- any two of the fin unit, the seal plate unit, and the mounting surface are fastened by friction welding.

In an embodiment, the side walls include a first side wall that forms an included angle with an extending direction of the first channel, and the liquid inlet and the liquid outlet are respectively provided at two ends of the first side wall in an extending direction of the first side wall; the seal plate unit includes at least a first seal plate, and the first seal plate is lapped at a position on the mounting surface corresponding to an adjacent turning channel; wherein the adjacent turning channel connects two adjacent first channels.

In an embodiment, the side walls include a second side wall that forms an included angle with an extending direction of the first channel, and the liquid inlet and the liquid outlet are provided at the same end of the second side wall in an extending direction of the second side wall; the seal plate unit includes at least a first seal plate and a second seal plate, wherein the first seal plate is lapped at a position on the mounting surface corresponding to an adjacent turning channel, and the adjacent turning channel connects two adjacent first channels; the second seal plate is lapped at a position on the mounting surface corresponding to a direct connection channel, and the direct connection channel is used to connect two first channels on two sides of the cooling plate unit or used to connect the first channel with the liquid inlet or the liquid outlet.

In an embodiment, the seal plate unit further includes an end portion seal plate, and the end portion seal plate is lapped at a position on the mounting surface corresponding to a position in the penetrating channel close to the liquid inlet and/or the liquid outlet.

In an embodiment, the liquid cooling heat dissipation plate further includes:
- a water inlet joint, fastened to the liquid inlet by friction welding; and
- a water outlet joint, fastened to the liquid outlet by friction welding.

In an embodiment, the fin unit includes at least one pair of fin bases, an inner surface of at least one of the fin bases is protruded with a fin assembly in a direction perpendicular to the inner surface, and the fin assembly and the fin base are integrally formed.

In an embodiment, a height of the fin assembly in the direction perpendicular to the inner surface of the fin base is less than half of a height of the cooling plate unit in the corresponding direction; the fin assembly is arranged in sections.

For corresponding technical details, reference may be made to foregoing related descriptions, and details are not described again.

In addition, an embodiment of this application further provides a liquid cooling heat dissipation plate, including:
- a cooling plate unit, wherein the cooling plate unit includes side walls that are circumferentially sealed, and a liquid inlet and a liquid outlet are provided at the side walls;
- at least one fin unit, wherein the fin unit is lapped on the side walls and forms at least one second channel, and the second channel forms a cooling liquid flow channel between the liquid inlet and the liquid outlet; and the fin unit and the side walls are fastened by friction welding.

In this embodiment, the fin unit may be formed by an aluminum extrusion process, and a required notch at a turning position of the flow channel may be formed through milling by a CNC process.

An embodiment of this application further provides a liquid cooling heat dissipation plate, including:
- a fin module, wherein the fin module comprises at least one fin unit, and a third channel is formed in the fin unit;
- seal plate units, wherein a liquid inlet and a liquid outlet are provided at the seal plate units, and the seal plate units are located at two opposite ends of each third channel, so that the third channel forms a cooling liquid flow channel between the liquid inlet and the liquid outlet; and the fin module and the seal plate units are fastened by friction welding.

In this embodiment, the fin module formed with a channel may be formed by an aluminum extrusion process, and a notch required at a turning position of the flow channel for flowing of a cooling liquid may be formed through milling by a CNC process, and then two ends of the flow channel being sealed using seal plates by a friction welding process.

In an embodiment, the liquid cooling heat dissipation plate further includes:
- a water inlet joint, fastened to the liquid inlet by friction welding; and
- a water outlet joint, fastened to the liquid outlet by friction welding.

In an embodiment, each fin unit includes a pair of two fin bases, an inner surface of at least one of the fin bases is protruded with a fin assembly in a direction perpendicular to the inner surface, and the fin assembly and the fin base are integrally formed.

In an embodiment, a height of the fin assembly in the direction perpendicular to the inner surface of the fin base is less than half of a height of a side wall in the corresponding direction; the fin assembly is arranged in sections.

For corresponding technical details, reference may be made to foregoing related descriptions, and details are not described again.

Based on the foregoing liquid cooling heat dissipation plate, an embodiment of this application further discloses a liquid cooling electronic device, the liquid cooling electronic device including an electronic device apparatus, and a liquid cooling heat dissipation plate being mounted on a surface of the electronic device apparatus in a butted manner, wherein the liquid cooling heat dissipation plate is the liquid cooling heat dissipation plate described above.

The above describes basic principles of this application with reference to specific embodiments, however, it should be noted that the advantages, strengths, effects, and the like mentioned in this application are merely examples but not limitations, and these advantages, strengths, effects, and the like cannot be considered to be necessary for each embodiment of this application. In addition, the specific details disclosed above are merely for illustrative purposes and to be easy to understand rather than limitation, and the above details do not limit this application to be implemented with the above specific details.

The block diagrams of the devices, apparatuses, equipment, and systems involved in this application are merely illustrative examples and are not intended to require or imply that the devices, apparatuses, equipment, and systems need to be connected, arranged, and configured in the manner shown in the block diagrams. A person skilled in the art will realize that the devices, apparatuses, equipment, and systems can be connected, arranged, and configured in any manner. Terms such as "comprise", "include", "have", and the like are open terms that mean "comprising but not limited to" and may be used interchangeably with the latter. The terms "or" and "and" used herein refer to the terms "and/or" and may be used interchangeably with the latter, unless the context clearly dictates otherwise. The expression "such as" used herein refers to the phrase "such as but not limited to" and may be used interchangeably with the latter.

It should be further noted that in the apparatuses, devices, and methods of this application, the components or steps may be decomposed and/or recombined. Such decomposition and/or recombination shall be regarded as equivalent solutions of this application.

The above description of the disclosed aspects is provided to enable a person skilled in the art to implement or use this application. Various modifications to these aspects are obvious to a person skilled in the art, and the general principles defined herein can be applied to other aspects without departing from the scope of this application. Therefore, this application is not intended to be limited to the aspects shown herein but in accordance with the widest scope consistent with the principles and novel features disclosed herein.

The above description has been given for the purposes of illustration and description. In addition, this description is not intended to limit the embodiments of this application to the form disclosed herein. Although a plurality of example aspects and embodiments have been discussed above, a person skilled in the art realizes some variations, modifications, changes, additions, and sub-combinations thereof shall fall within the protection scope of this application.

What is claimed is:

1. A liquid cooling heat dissipation plate, comprising:
a cooling plate unit, wherein the cooling plate unit comprises two opposite mounting surfaces and side walls between the two mounting surfaces, a liquid inlet and a liquid outlet are provided at the side walls, the liquid inlet is in connection with the liquid outlet through a penetrating channel, and the penetrating channel respectively penetrates the two mounting surfaces;
a fin unit; and
a seal plate unit,
wherein the penetrating channel comprises at least one first channel, the fin unit is lapped at positions on the two mounting surfaces corresponding to the same first channel, the seal plate unit is lapped at a position on the mounting surface corresponding to positions in the penetrating channel that are not covered by the fin unit, so that the penetrating channel between the liquid inlet and the liquid outlet forms a cooling liquid flow channel;
any two of the fin unit, the seal plate unit, and the mounting surface are fastened by friction welding,
the side walls comprise a second side wall that forms an included angle with an extending direction of the first channel, and the liquid inlet and the liquid outlet are provided at the same end of the second side wall in an extending direction of the second side wall, and
the seal plate unit comprises at least a first seal plate and a second seal plate, wherein the first seal plate is lapped at a position on the mounting surface corresponding to an adjacent turning channel, and the adjacent turning channel connects two adjacent first channels; and the second seal plate is lapped at a position on the mounting surface corresponding to a direct connection channel, and the direct connection channel is used to connect two first channels on two sides of the cooling plate unit or used to connect the first channel with the liquid inlet or the liquid outlet.

2. The liquid cooling heat dissipation plate according to claim 1, wherein the seal plate unit further comprises an end portion seal plate, and the end portion seal plate is lapped at a position on the mounting surface corresponding to a position in the penetrating channel close to the liquid inlet and/or the liquid outlet.

3. The liquid cooling heat dissipation plate according to claim 1, further comprising:
a water inlet joint, fastened to the liquid inlet by friction welding; and
a water outlet joint, fastened to the liquid outlet by friction welding.

4. The liquid cooling heat dissipation plate according to claim 1, wherein the fin unit comprises at least one pair of fin bases, an inner surface of at least one of the fin bases is protruded with a fin assembly in a direction perpendicular to the inner surface, and the fin assembly and the fin base are integrally formed.

5. The liquid cooling heat dissipation plate according to claim 4, wherein a height of the fin assembly in the direction perpendicular to the inner surface of the fin base is less than half of a height of the cooling plate unit in the corresponding direction; and the fin assembly is arranged in sections.

6. A liquid cooling electronic device, comprising an electronic device apparatus, wherein a liquid cooling heat dissipation plate is mounted on a surface of the electronic device apparatus in a butted manner, and the liquid cooling heat dissipation plate comprises:
a cooling plate unit, wherein the cooling plate unit comprises two opposite mounting surfaces and side walls between the two mounting surfaces, a liquid inlet and a liquid outlet are provided at the side walls, the liquid inlet is in connection with the liquid outlet through a penetrating channel, and the penetrating channel respectively penetrates the two mounting surfaces;

a fin unit; and
a seal plate unit,
wherein the penetrating channel comprises at least one first channel, the fin unit is lapped at positions on the two mounting surfaces corresponding to the same first channel, the seal plate unit is lapped at a position on the mounting surface corresponding to positions in the penetrating channel that are not covered by the fin unit, so that the penetrating channel between the liquid inlet and the liquid outlet forms a cooling liquid flow channel;

any two of the fin unit, the seal plate unit, and the mounting surface are fastened by friction welding, the side walls comprise a second side wall that forms an included angle with an extending direction of the first channel, and the liquid inlet and the liquid outlet are provided at the same end of the second side wall in an extending direction of the second side wall, and the seal plate unit comprises at least a first seal plate and a second seal plate, wherein the first seal plate is lapped at a position on the mounting surface corresponding to an adjacent turning channel, and the adjacent turning channel connects two adjacent first channels; and the second seal plate is lapped at a position on the mounting surface corresponding to a direct connection channel, and the direct connection channel is used to connect two first channels on two sides of the cooling plate unit or used to connect the first channel with the liquid inlet or the liquid outlet.

\* \* \* \* \*